United States Patent [19]
Alden

[11] Patent Number: 5,949,002
[45] Date of Patent: Sep. 7, 1999

[54] MANIPULATOR FOR AUTOMATIC TEST EQUIPMENT WITH ACTIVE COMPLIANCE

[75] Inventor: John Christopher Alden, Medford, Mass.

[73] Assignee: Teradyne, Inc., Boston, Mass.

[21] Appl. No.: 08/968,316

[22] Filed: Nov. 12, 1997

[51] Int. Cl.$^6$ .................................................. G01D 21/00
[52] U.S. Cl. ............................................................ 73/866.5
[58] Field of Search .............................. 73/866.5, 865.8, 73/105, 865.7; 324/765–769, 754; 33/558, 559, 561

[56] References Cited

U.S. PATENT DOCUMENTS

| | | | |
|---|---|---|---|
| 4,328,553 | 5/1982 | Rhodes . | |
| 5,241,870 | 9/1993 | Holt | 73/866.5 |
| 5,345,816 | 9/1994 | Clabes et al. | 73/105 |
| 5,390,129 | 2/1995 | Rhodes . | |
| 5,727,326 | 3/1998 | Mies et al. | 33/559 |
| 5,755,038 | 5/1998 | McMurtry | 33/559 |
| 5,821,440 | 10/1998 | Khater et al. | 73/866.5 |

FOREIGN PATENT DOCUMENTS

| | | |
|---|---|---|
| 260 096 | 3/1988 | European Pat. Off. . |
| 699 913 | 3/1996 | European Pat. Off. . |
| 96/26446 | 8/1996 | WIPO . |
| 96 29649 | 9/1996 | WIPO . |
| 96/30772 | 10/1996 | WIPO . |

OTHER PUBLICATIONS

Anonymous: "Dynamic Burn–In System," Jan. 1980, IBM Technical Disclosure Bulletin, vol. 22, No. 8A, pp. 3065–3068, XP002070868, New York, US.

*Primary Examiner*—Robert Raevis
*Attorney, Agent, or Firm*—Edmund J. Walsh

[57] ABSTRACT

A manipulator for an automatic test equipment test head. The manipulator includes a plurality of motors that are coupled with load cells. A controller provides motor control signals based on the output of the load cells. The manipulator may be operated in compliant mode in which the motors drive the manipulator to move in response to external forces. The manipulator can be used in conjunction with a docking system in which a mechanical interface between the test head and the handling device defines the position of the test head relative to the handling device.

15 Claims, 3 Drawing Sheets

MANIPULATOR FOR AUTOMATIC TEST EQUIPMENT WITH ACTIVE COMPLIANCE

This invention relates generally to manipulators for test heads and more specifically to manipulators which are used in positioning test heads that are docked to handling devices.

Semiconductor test equipment is often constructed with a test head that contains electronic circuitry that must be very close to the device under test. Physical closeness is particularly important when a long cable between the device under test and the electronic circuitry making test measurements would create inaccuracies. Consequently, much circuitry is placed in the test head of a semiconductor test system. The test system might weigh literally hundreds of kilograms. The cable connecting the test head to the rest of the test system can also be large, weighing over 100 kilograms.

Even though the test head is very large, it must still be movable. The test head is usually connected to a handling device which presents to the test head semiconductor components on wafers or as packaged components. The test head must be moveable so that it can interface, or "dock" with the handling device. Not only must the test head be movable to be near the handling device, it must also be movable into different orientations so that the test points on the test head align with the semiconductor components in the handling device.

For example, some handling devices operate in a "DUT up" configuration. In that configuration, the DUT, or device under test, is on the upper surface of the handling device and the test head rests on top of the handling device. Other handling devices operate in a "DUT down" configuration. In that configuration, the test head is rotated 180 degrees from the DUT up configuration and connects to the bottom side of the handling device. There are also other possible configurations, such as DUT vertical.

A test system is generally designed to interface with many different types of handling devices. In order to get the very heavy test head into one of a number of different positions, the test head is held in a manipulator. The manipulator supports the test head and can be moved, often with six degrees of freedom, to put the test head in almost any configuration. Many manipulators are motorized to make it easier for a human to move the heavy test head.

In addition, the test head must often be moved after it is docked to the handling device. Sometimes, the test head must be moved to change a fixture or to access the handling device for service. A difficulty in moving the test head after it has been docked is that it often takes a long time to re-dock the test head. Modern semiconductors are so small and contain so many test points that great care must be taken in aligning the semiconductor under test with the test system. After docking, a calibration routine is often performed by the tester and the handling device to determine the relative position of the test system and the handling device. This calibration routine can be performed in various ways. For example, calibration might be done with a camera on the handling device that can recognize the test probes on the test head, thereby determining the relative position of the test head and the handling device. Alternatively, calibration might be done by moving a sample device in the handling system until electrical contact is made between the sample device and the test system. By detecting the position at which contact is made, the relative position of the test head and the handling device can be determined. Once the position of the test head relative to the handling device is determined, the handling device can adjust the position of the semiconductor device to ensure that the semiconductor connects with the test system.

Regardless of which method of calibration is used, the amount of time required for calibration might be quite long. It is highly desirable to not have to repeat the calibration process each time the test head is moved. The problem with a conventional docking arrangement is that, after the test head is moved, it often does not return to exactly the same docking position. "Play" in the mechanical interface between the test head and the handling device means that the parts will not return to exactly the same position after they are moved. Additionally, the cable attached to the test head, because it is so heavy, can influence the orientation of the test head. When the test head is moved, the cable rarely returns to the same spot. Thus, the forces applied by the cable change whenever a test head is moved, making it less likely that the test head will return to the same spot.

One innovative solution has been implemented by Teradyne, Inc. The solution, called the K-dock™ interface, involves the use of a mechanical interface between a test head and a handling device that uses contacts shaped to provide limited docking positions. Whenever the system is docked, the test head returns to the same relative position as the handling device. This docking system is described in U.S. patent application Ser. No. 08/463,227 by Slocum et al., which is hereby incorporated by reference.

With this approach, the final positioning of the test head is dictated by the mechanical interface rather than the settings of the manipulator. For this to work, "compliance" must be built into the manipulator. "Compliance" means that, at controlled times, the manipulator does not rigidly hold the test head in place. A manipulator with mechanical compliance is shown in U.S. Pat. No. 08/808,131 filed Feb. 28, 1997 by Slocum, et al., which is hereby incorporated by reference.

The manipulator in the aforementioned application Ser. No. 08/808,131 is a six degree of freedom manipulator. Various mechanical methods were used to provide compliance. For example, in some directions, compliance was provided by simply releasing a brake that allowed a part of the manipulator to move. As another example, compliance was provided in the vertical direction by an air cylinder that could be compressed. In other directions, the motors were spring biased such that they could move a small amount if pressed.

I have discovered certain ways in which this design can be improved. First, the mechanical methods of providing compliance are often sensitive to test head weight. For example, a spring or air cylinder should provide a force to hold the test head in the middle of its travel. If the test head is heavier or lighter than the one for which the manipulator was designed, the test head will likely wind up at one end of its travel. Therefore, the amount of compliance will be limited.

A similar problem exists if the test head position changes. The force exerted by the test head on various joints or bearings of the manipulator will depend on test head position. The required compliance of those joints will therefore change as the test head position changes.

It would be highly desirable if the compliance of the manipulator were not sensitive to the weight or orientation of the test head or cables attached to the test head.

SUMMARY OF THE INVENTION

With the foregoing background in mind, it is an object of the invention to provide a manipulator for holding a test head for a semiconductor test system.

It is also an object to provide an improved manipulator for compliant docking.

The foregoing and other objects are achieved in a manipulator having at least one motor driving motion of the test head. A load cell measures forces on the test head. During one operating mode, the output of the load cell is not used to control the motor. However, in compliant mode, the output of the load cell is used to control the position of the test head such that the force on the test head remains constant.

In one embodiment, the range of drive of the motor is limited.

In yet another embodiment, the range of force on the load cell is limited and the motor is shut down if the force exceeds a predetermined level.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
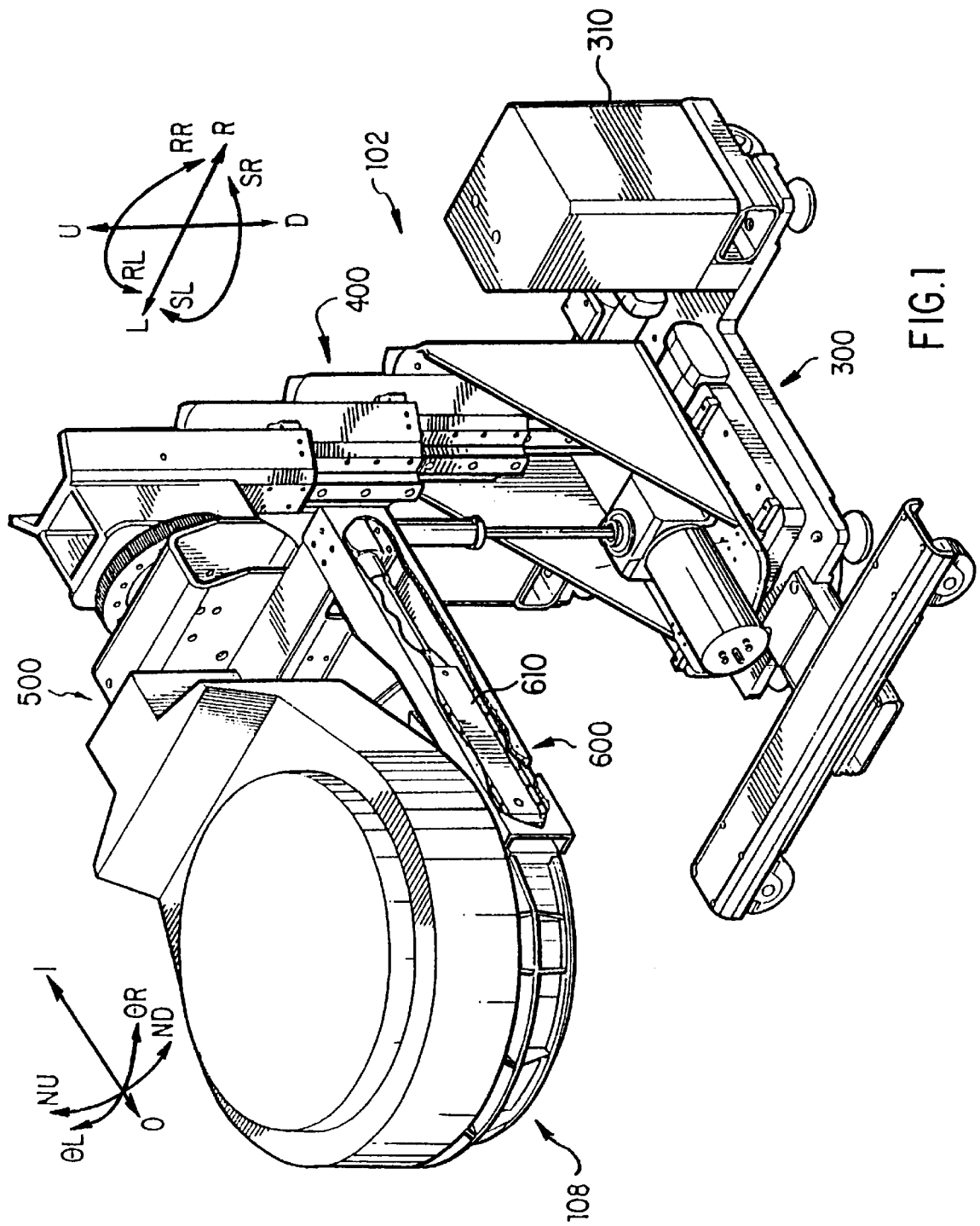
FIG. 1 illustrates a manipulator according to the prior art.

FIG. 1 shows a manipulator 102 holding a test head 108. In use, a cable (not shown) would typically be used to attach test head 108 to a tester body (not shown).

Manipulator 102 is made from various assemblies that allow test head 108 to be moved with multiple degrees of freedom. Test head 108 is mounted in cradle assembly 600. The mountings allow test head 108 to move in the nod direction, indicated as NU and ND.

Each mounting is on a carriage 610 that can slide along the arm. The carriage 610 in each arm can be moved independently. If the carriages move in the same direction, test head 108 moves in the In or Out direction, indicated as I or O in FIG. 1. However, if the carriages 610 are moved in opposing directions, test head 108 will rotate in the directions indicated as ΘL or ΘR.

Cradle assembly 600 is attached to a bearing assembly 500. Bearing assembly 500 allows rotation in the direction indication RL or RR.

Bearing assembly 500 is attached to a telescoping shaft assembly 400. Shaft assembly 400 allows motion in the Up and Down direction, indicated as U and D.

Shaft assembly 400 is mounted on a base assembly 300. Base assembly 300 includes a linear bearing that allows translation in the directions indicated L and R. Base assembly 300 also includes a rotary bearing that allows rotation in a direction indicated as SL or SR.

Each motion might be motor driven to make positioning of test head 108 easier. For example, carriages 610 could each be attached to a motor. Likewise, shaft assembly 400 likely contains a motor. The motors are controlled by electronics in control unit 310. Control unit 310 contains motor control circuitry as known in the art. Examples of known control circuitry are microprocessors, microcontrollers and programmable logic controller. All of these devices are commercially available from numerous sources.

A human operator can enter commands to the control unit 310. The commands indicate when and the direction in which test head 108 is to be moved. Control unit 310 translates command inputs into control signals that turn on and off the various motors within manipulator 102 to drive test head 108 to the desired position.

Command inputs can also be input to control unit 310 from the tester or handling device with which manipulator 102 is operating. One important command input when the K-dock™ interface is used indicates that the manipulator should be placed in compliant mode to enable docking. The control program executed by control unit 310 changes when the manipulator is in compliant mode.

The control program in compliant mode is operates on force feedback from load cells mounted throughout the manipulator. Load cells are commercially available devices that produce an electrical output proportional to the force along one axis of the load cell. Examples of vendors which sell load cells are Omega and SensoTech. The electrical output of the load cell serves as an input to control unit 310.

For each direction in which compliant motion is desired, there should be at least one load cell. The load cell should be coupled at one end to the motor that drives motion in that direction. The load cell should be mounted such that it can measure the force applied by the load—the test head—on the motor. Several mounting configurations can be used to achieve this result. One configuration is to couple one end of the load cell to the load and the other end to the motor. Another configuration is to couple one end of the load cell to the motor and the other end to a fixed position. In this configuration, the motor must be allowed to move a slight amount. A flexure or bearing mounting scheme can be used to allow the necessary movement. Regardless of mounting configuration, the load cell measures the force applied by the load to the motor in the direction of travel.

Figure 2:
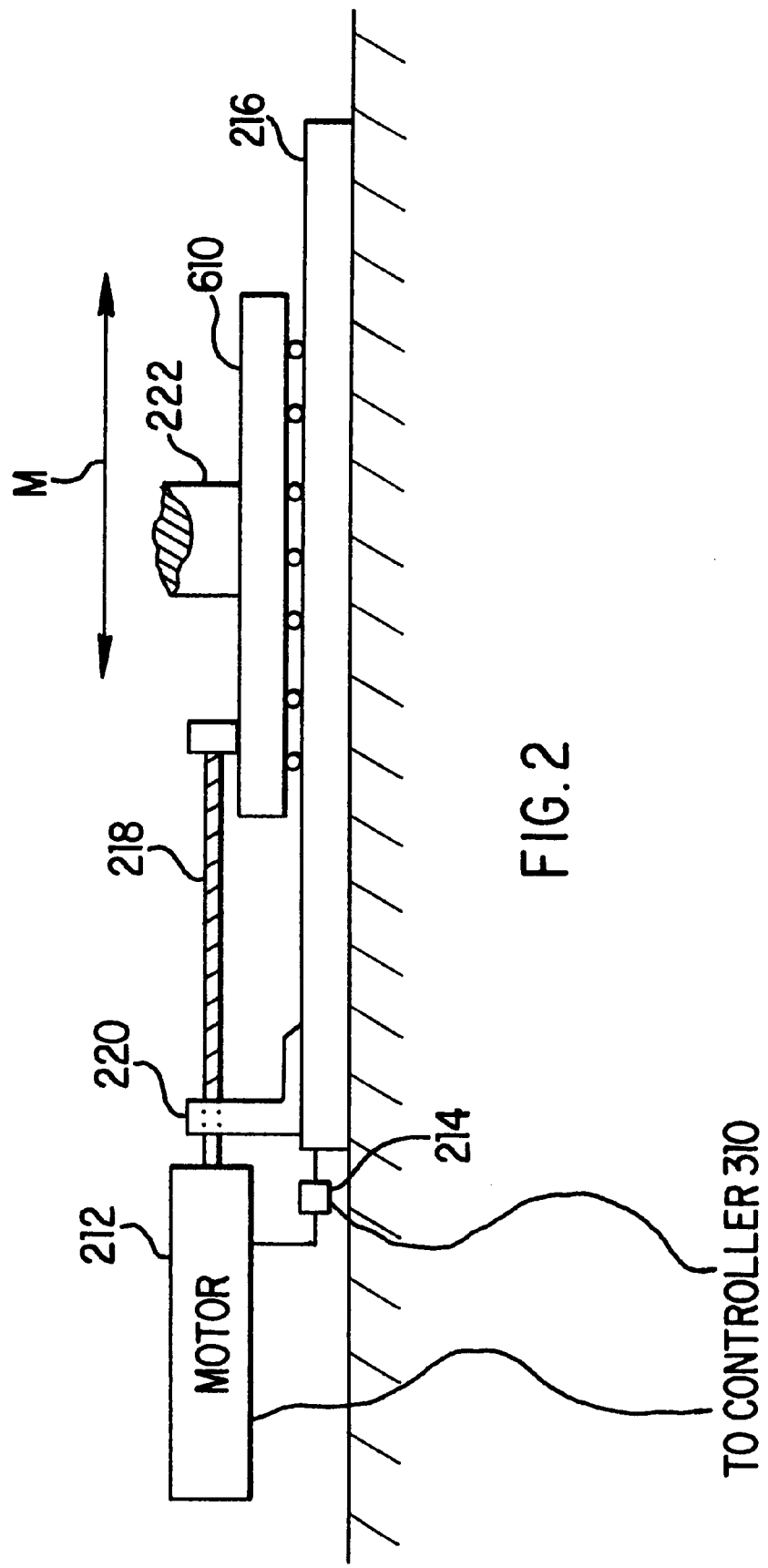
FIG. 2 is a block diagram of a manipulator incorporating a load cell according to the invention.

FIG. 2 gives one example of the mounting of a load cell 214. As depicted in FIG. 2, load cell 214 measures force in the direction M in which a carriage 610 moves.

One end of load cell 214 is coupled to motor 212. The other end of load cell 214 is coupled to rail 216. Carriage 610 slides along rail 216 to provide motion in the direction M. Thus, rail 216 does not move when carriage 610 moves in direction M.

Motor 212 drives lead screw 218, which pushes or pulls carriage 610 in direction M. Motor 212 is mounted in bracket 220 that allows limited motion of the motor in the direction M, but provides support and restrains motion in other directions.

Test head 108 (FIG. 1) is connected to carriage 610 by means of shaft 222. Shaft 222 might be attached to carriage 610 through a ball joint or other mechanism. A force applied to test head 108 is measured by load cell 214. Likewise, if the weight of test head 108 applies force on carriage 610, that force is likewise measured by load cell 214.

Motor 212 has a control input that is connected to controller 310. The control input is made up of a series of wires through which electrical signals are carried. These electrical signals control motor 212, in a known manner. These control inputs allow controller 310 to regulate the direction and speed of motor 212.

Load cell 214 has a measurement output that is connected to controller 310. The electrical signal on that line indicates the force measured by load cell 214. It will be appreciated by one of skill in the art that well known elements of an electromechanical system, such as power connections, are not expressly shown but are used in conjunction with the invention.

The number of load cells mounted on manipulator 102 depends on the number of directions in which motion will be motorized. Also, it will depend on the number of directions in which compliant motion will be required during docking. Preferably, each axis about which motion is mechanized will have a load cell for use in compliant mode.

In a preferred embodiment, there will be one load cell attached to each carriage 610 in the cradle assembly. The cradle assembly 600 is symmetrical on each side of test head 108. Therefore, there are two load cells in cradle assembly 600.

In a preferred embodiment, there will also be a load cell in bearing assembly 500 and telescoping shaft assembly 400. Within base assembly 300, there will also be a load cell mounted to measure force in the direction indicated as L-R.

FIG. 3 illustrates how controller 310 uses the outputs from each of the load cells to control its associated motor. The load cell and motor mounted to sense force and provide motion in a particular direction are used together for processing. The output of the load cell is used to control the motor. Each motor, though, is processed independently. FIG. 3 shows the processing for one motor. When multiple motors are used, the processing shown in FIG. 3 is separately performed for each.

Figure 3B:
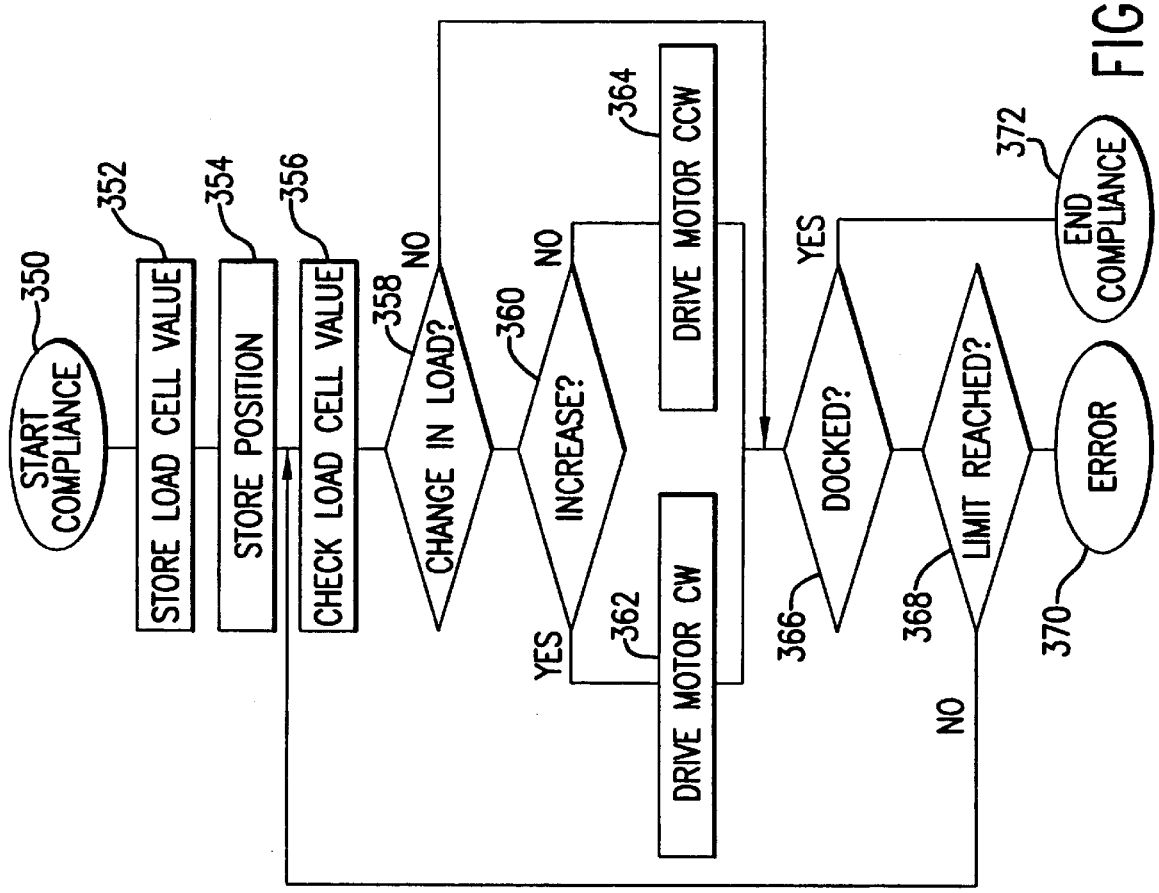
FIG. 3B illustrates a flow chart of the control program during a compliant mode of operation for a manipulator incorporating the invention.
Figure 3A:
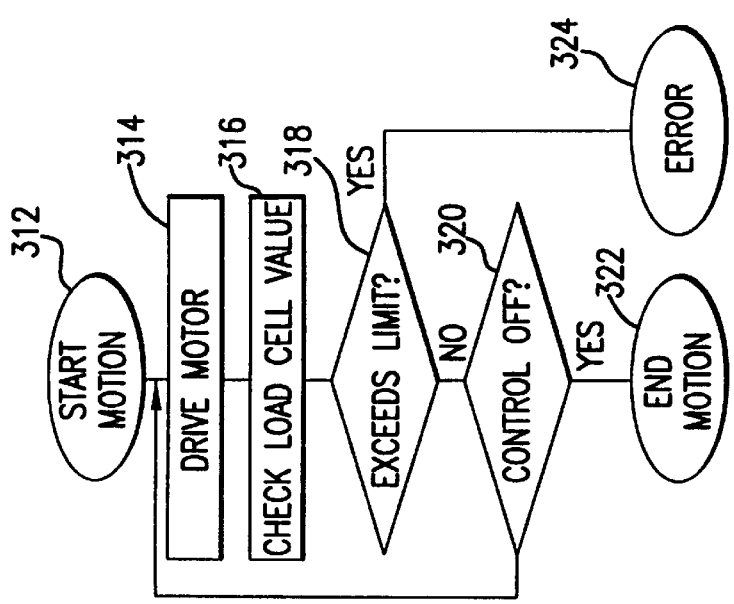
FIG. 3A illustrates a flow chart of the control program during a normal mode of operation for a manipulator incorporating the invention.

FIG. 3A shows how the load cell might be used during a "normal" mode of operating manipulator 102. In normal mode, an operator enters commands, such as through a pendant, joy stick or other similar input device, that indicate the directions in which test head 108 should be moved. Thus, the process of moving test head 108 begins at step 312 when a command from a human operator is received to move test head 108.

At step 314, controller 310 generates commands that drive the motor. The direction in which the motor will be driven depends on the command received.

At step 316, controller 310 reads the value from the load cell. At step 318, the value of the load cell is compared to limits. If the limits are exceeded, processing proceeds to an error handler program at step 324.

The error handler at step 324 will, in a preferred embodiment, cause the manipulator to stop. It will also actuate an audio or visual alarm that alerts the operator to a problem.

The limit used at step 318 will be set to identify a force that should not occur in normal operation. Therefore, the limits will signal an improper, and therefore potentially unsafe, operating condition. The specific value of the limit that is used will depend on the specific test head and manipulator design. Each motor will have its own limits. The limits might, in a preferred embodiment, be different depending on the direction in which the motor is driving the test head. For example, the force limit when driving the test head in the U direction would be larger than the force limit when driving the test head in the down direction.

Or, more complicated limits might be programmed based on the orientation of the test head. The amount of force that would be "normal" on a motor driving carriage 610 would be much less with the test head in the position shown in FIG. 1 as opposed to having the test head rotated 90° in the RL direction. In a preferred embodiment, controller 310 will contain tables in computer memory that store the limits.

Alternatively, the limits might be computed dynamically. The limit might be computed by measuring the output of the load cell before motion is started. The limit would then be computed by adding an allowed deviation to that measurement. In this embodiment, the allowed deviation is stored in memory inside controller 310.

Regardless of how the limits are set, if the limits are not exceeded, execution proceeds to step 320. At step 320, a check is made whether the operator input still indicates more motion of manipulator 102 is required. If the operator input is off, no further motion is required, and the process ends at step 332. Commands to the motor stop the motor and lock it in position. When no motion is required, manipulator 102 should be as rigid as possible so that test head 108 is held still.

Alternatively, if the operator control is still on, execution returns to step 314 where the motor is drive further in the required direction.

As described in the above mentioned patent applications, significant performance advantages in a test system can be achieved if the position of the test head is not set by the manipulator. Rather, it is desired that the position of the test head be set by a mechanical interface between the test head and a handling device. For that to happen, though, the manipulator must be able to enter a "compliant mode". In compliant mode, the test head can be pushed or pulled into the required position, as dictated by the mechanical interface.

Compliant mode operation is illustrated in FIG. 3B. Compliant mode operation starts at step 350. Step 350 is executed when controller 310 receives a command indicating that compliant mode should be entered. The command to enter compliant mode might come from a user.

Alternatively, the command might come from the test head or the handling device or a computer work station controlling both the tester and the handling device. In a preferred embodiment, compliant mode is not entered until the pieces of the mechanical interface on the test head are latched to the pieces of the mechanical interface on the handling device. After the pieces are latched, they are drawn together to define the final position of the test head. Thus, in a preferred embodiment, a sensor is employed to generate a signal indicating that the pieces of the interface have been latched. Compliant mode lasts until the test head is docked in a position dictated by the components of the mechanical interface.

Once it is determined that compliant mode should be entered, execution proceeds to step 352. At step 352, the value of the load cell is stored. As mentioned above, the processing of FIG. 3B is performed once for each motor in compliant mode. Preferably, this value is stored in digital form in a computer memory that is a part of controller 310.

At step 354, the position of the test head is also stored. Positional sensors are known in the electromechanical are and manipulator 102 could be equipped with such sensors. The position of test head 108 in any of the directions indicated in FIG. 1 can therefore be determined and recorded.

At step 356, the load cell value is measured again. If the force on the motor has changed, processing continues at step 360. A change in the force indicates that the mechanical interface is trying to pull or push test head 108 into a different position. However, if the force has not changed, execution proceeds to step 366.

Where the force on test head 108 has changed, step 360 determines whether that force has increased or decreased. If the force has increased, execution proceeds to step 362 where the motor is driven clockwise. On the other hand, if the force has decreased, execution proceeds to step 364 where the motor is driven counter-clockwise.

In this way, the motor is driven to ensure that the force in the test head stays the same. As external devices place force on the test head, the test head is driven in the direction of those forces. In the preferred embodiment, those external forces are imposed by the mechanical interface between the test head and the handling device.

At step 366, a check is made to determine whether the test head and the handling device are docked. In a preferred embodiment, this step involves checking a test signal that is generated by the mechanical interface. However, various other ways could be used to determine that the test head has been moved to the required position relative to the handling device.

Once the test head is docked to the handling device, execution proceeds to step 372. At step 372, compliant mode is ended. Compliant mode is ended by sending control signals to the motor that lock it rigidly into position.

If step 366 determines that the test head and handling device are not docked, execution proceeds to step 368. At step 368, one or more checks are made to determine whether compliant mode should be ended before the test head and the handling device are docked. For example, a limit representing the distance the test head should move in compliant mode might be programmed into control unit 310. Alternatively, compliant mode might be programmed to last for only a certain period of time. Step 368 would, for example, check whether limits on time, distance, or other factors have been exceeded. If limits have been exceeded, execution would proceed to step 370, where compliant mode ends. Exceeding limits might indicate an error condition. Thus, step 370 might also include an output indicating an error condition, such as an audio or visual alarm signal.

When the test head and handling device are not docked and limits have not been exceeded, execution returns to step 356. The value of the load cell is checked again and the test head is moved, in a closed loop fashion, to move the test head in response to the force. It will be appreciated that FIG. 3 shows the steps of a program taken in discrete steps. Such would be the case were the control program implemented as a digital program on a microprocessor. However, the motor and load cell are intended to form a closed loop feedback control system and, what are shown as discrete steps, might be performed essentially simultaneously.

Having described one embodiment, numerous alternative embodiments or variations might be made. For example, the number and placement of motors and load cells can be varied depending on the design of the manipulator. Not every motion needs to be motorized. In a preferred embodiment, load cells will be provided only for carriages 610 in cradle assembly 600 and telescoping assembly 400.

Also, it was described that the load cells were used in normal mode to determine whether an error condition occurred in addition to be using in compliant mode. These two functions need not be provided in the same manipulator. However, if the load cells are installed in the manipulator to provide compliance, very little added cost is imposed to use the load cells to check for error conditions in normal operation.

In addition, it should be appreciated that FIG. 3B shows the motor is driven clockwise or counter-clockwise depending on the change in the measured force. The direction in which the motor must be driven to provide complaint motion will depend on the way in which the motor is attached to the manipulator.

Also, it was described that compliant mode is used for docking the test head to the handling device. Compliant mode could be used to allow a person to position a manipulator by pressing on it. Instead of using a pendant to position the test head, a human operator could apply force to the test head using a set of handles. These forces would be measured by the load cells in the manipulator. The controller would then control the motors in the manipulator to drive the test head in the direction of the applied force.

Also, it was described that each motorized axis for which active compliance was provided was treated independently. In some instances, force applied in only one direction will "couple" to load cells measuring force in different directions. It might, therefore, be necessary or desirable to include in FIG. 3B a force decoupling step. For example, at step 356 where the value of one load cell is measured, the measured value might be corrected by adding or subtracting some fraction of the force measured at another load cell. The fraction would be selected based on the amount of coupling between the two directions.

Further, it was described that load cells are used to measure forces. Other force measuring devices, such as strain gauges, might be used. Likewise, it was described that a lead screw 218 to couple the motor to the load. Other coupling mechanisms, such as belt drives or ball screws, might be used, depending on the specific design of the manipulator.

Therefore, the invention should be limited only by the spirit and scope of the appended claims.

What is claimed is:

1. An automatic test system of the type having a test head and a handling device, comprising:
   a) a manipulator for the test head, comprising
      i) a base element,
      ii) a moveable element movably mounted with respect to the base element,
      iii) a motor, having an electrical control input, the motor being mechanically coupled to the movable element, thereby driving the movable element with respect to the base,
      iv) a load cell having a first end and a second end and an electrical output producing an electrical signal in proportion to the force on the load cell in the direction between the first end and the second end, at least one end of the load cell being mechanically coupled to the motors wherein a second end of the load cell is coupled to the base element, and
      v) a controller having an electrical input connected to the electrical output of the load cell and an electrical output connected to the electrical control input of the motor, the controller producing an output that varies in proportion to the input.

2. The automatic test system of claim 1 wherein the moveable element comprises a carriage to which the test head is coupled and the base element comprises a linear rail and a linear bearing between the carriage and the linear rail.

3. The automatic test system of claim 1 wherein the moveable element comprises a telescoping shaft.

4. The automatic test system of claim 1 additionally comprising a bearing mounted to the base element, said bearing slidably supporting the motor.

5. An automatic test system of the type having a test head and a handling device, comprising:
   a) a manipulator for the test head, comprising a plurality of motorized mechanisms, each mechanism having
      i) a base element,

9 ii) a movable element movably mounted with respect to the base element, iii) a motor, having an electrical control input, the motor being mechanically coupled to the movable element, thereby driving the movable element with respect to the base, and iv) a load cell having a first end and a second end and an electrical output producing an electrical signal in proportion to the force on the load cell in the direction between the first end and the second end, the first end of the load cell being mechanically coupled to the motor; and b) a controller having a plurality of electrical inputs, each connected to the electrical output of one of the load cells and a plurality electrical outputs each connected to the electrical control input of one of the motors, the controller producing output signals that each vary in proportion to the input from a load cell.

6. The automatic test system of claim 5 wherein the moveable element of one of the plurality motorized mechanisms comprises a carriage and the moveable element of a second of the plurality of motorized mechanisms comprises a vertical shaft assembly.

7. The automatic test system of claim 5 additionally comprising a lead screw coupling the motor to the moveable element.

8. The automatic test system of claim 5 wherein the base elements of two of the motorized mechanisms comprise opposing cradle arms with the test head mounted between the cradle arms.

9. A method of operating an automatic test system of the type having a handling device and a test head mounted on a manipulator, comprising the steps of:

a) generating a signal indicating the test head is latched to the handling device;

b) measuring the force at at least one point in the manipulator as a reference;

10 c) applying force on the test head to urge it into a docked position;

d) driving a motor within the manipulator to move the test head in a direction that makes the force on the test head closer to the reference force; and e) placing the motor in a rigid state when the test head is in the docked position.

10. The method of claim 9 additionally comprising the steps of monitoring the motion of the test head and ceasing the step of driving when the amount of motion of the test head exceeds a limit.

11. The method of claim 10 wherein the step of monitoring the motion of the test head comprises monitoring the distance traveled by the test head.

12. The method of claim 9 additionally comprising the steps of, prior to latching the test head to the handling device, driving a motor to move the test head while monitoring the output of the load cell and stopping driving the motor when the output of the load cell exceeds a threshold value.

13. The method of claim 9 wherein the step of measuring the force at at least one point comprises measuring the force asserted on the motor in the direction in which the motor drives the test head.

14. The method of claim 13 wherein the step of measuring the force includes storing an indication of the force in memory associated with a computerized controller.

15. The method of claim 9 additionally comprising, prior to generating a signal, the steps of:

a) applying a force to the test head with a human operator;

b) driving a motor within the manipulator to move the test head in a direction that reduces the force on the test head.

* * * * *